(12) United States Patent
Kobayashi et al.

(10) Patent No.: US 10,937,635 B2
(45) Date of Patent: Mar. 2, 2021

(54) VACUUM PROCESSING APPARATUS

(71) Applicant: Hitachi High-Technologies Corporation, Tokyo (JP)

(72) Inventors: Hiroyuki Kobayashi, Tokyo (JP); Nobuya Miyoshi, Tokyo (JP); Kazunori Shinoda, Tokyo (JP); Kenji Maeda, Tokyo (JP); Yutaka Kouzuma, Tokyo (JP); Satoshi Sakai, Tokyo (JP); Masaru Izawa, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 106 days.

(21) Appl. No.: 16/378,783

(22) Filed: Apr. 9, 2019

(65) Prior Publication Data

US 2019/0237302 A1 Aug. 1, 2019

Related U.S. Application Data

(63) Continuation of application No. 15/072,392, filed on Mar. 17, 2016, now Pat. No. 10,290,472.

(30) Foreign Application Priority Data

Feb. 10, 2016 (JP) ................................ 2016-023693

(51) Int. Cl.
*H01J 37/32* (2006.01)
*H01L 21/67* (2006.01)

(52) U.S. Cl.
CPC .. *H01J 37/32449* (2013.01); *H01J 37/32339* (2013.01); *H01J 37/32422* (2013.01); *H01J 37/32522* (2013.01); *H01J 37/32724* (2013.01); *H01L 21/6719* (2013.01); *H01L 21/67069* (2013.01); *H01L 21/67115* (2013.01); *H01J 2237/334* (2013.01)

(58) Field of Classification Search
CPC .................................................. H01L 21/67115
See application file for complete search history.

(56) References Cited

U.S. PATENT DOCUMENTS

| 2002/0035962 A1 | 3/2002 | Sakuma |
| 2007/0267143 A1 | 11/2007 | Carlson |
| 2008/0179291 A1 | 7/2008 | Collins |

(Continued)

FOREIGN PATENT DOCUMENTS

| EP | 1 001 454 A2 | 5/2000 |
| JP | 62-130275 A | 6/1987 |
| JP | 4-293781 A | 10/1992 |

(Continued)

OTHER PUBLICATIONS

Japanese Office Action received in corresponding Japanese Application No. 2019-214960 dated Sep. 29, 2020.

*Primary Examiner* — Joseph A Miller, Jr.
(74) *Attorney, Agent, or Firm* — Mattingly & Malur, PC

(57) ABSTRACT

In a vacuum processing apparatus including: a vacuum container including a processing chamber therein; a plasma formation chamber; plate members being arranged between the processing chamber and the plasma formation chamber; and a lamp and a window member being arranged around the plate members, in order that a wafer and the plate members are heated by electromagnetic waves from the lamp, a bottom surface and a side surface of the window member is formed of a member transmitting the electromagnetic waves therethrough.

10 Claims, 7 Drawing Sheets

(56) References Cited

U.S. PATENT DOCUMENTS

2015/0083582 A1    3/2015   Dhindsa et al.
2015/0129131 A1    5/2015   Li

FOREIGN PATENT DOCUMENTS

| JP | 2008-166848 A | 7/2008 |
|----|---------------|--------|
| JP | 2015-65434 A | 4/2015 |
| JP | 2015-185594 A | 10/2015 |

VACUUM PROCESSING APPARATUS

CLAIM OF PRIORITY

The present application claims priority from Japanese Patent Application No. 2016-023693 filed on Feb. 10, 2016, the content of which is hereby incorporated by reference into this application.

BACKGROUND OF THE INVENTION

Field of the Invention

The present invention relates to a vacuum processing apparatus which performs etching through plasma irradiation and optical heating.

Description of Related Art

Due to demands on a semiconductor device for achieving lower power consumption and increased storage capacity, further miniaturization and three-dimension of a device structure have been in progress. In manufacturing a device with a three-dimensional structure, the structure is sterically complicated, and thus in addition to "vertical etching" which is performed in a direction vertical to a conventional wafer surface, "isotropic etching" which can also be performed in a horizontal direction have been frequently used. Conventionally, the horizontal etching has been performed through the isotropic etching" by way of wet processing using chemical solution, but due the progressed miniaturization, a problem of pattern collapse caused by surface tension of the chemical solution has become obvious. Thus, in the isotropic etching, there have arisen needs for replacement of the conventional wet processing using the chemical solution with dry processing not using the chemical solution.

Known as a method of performing isotropic etching through dry processing with high accuracy (dry removal) is an etching method of an absorbing and desorbing type (for example, Japanese Patent Application Laid-open No. 2015-185594). With this method, radical generated by plasma is first absorbed to a surface of an etched layer of a processed body, and a reaction layer is formed through chemical reaction (absorption process). Next, heat energy is given to desorb and remove this reaction layer (desorption process). This absorption process and this desorption process are repeated alternately to perform the etching. With this method, in the absorption process, upon reach of the reaction layer, which has been formed on the surface, at a given thickness, the reaction layer prevents the radical from arriving at an interface between the etched layer and the reaction layer, thus rapidly decelerating growth of the reaction layer. Thus, at an inner part of a complicated pattern form, even with a variation in an amount of radical incidence, adequately setting sufficient absorption time permits formation of an altered layer with a uniform thickness, advantageously making it possible to make the amount of etching uniform without depending on the pattern form. Moreover, the amount of etching per cycle can be controlled at a level of several nanometers or below, thus advantageously permitting adjustment of an amount of processing with a dimensional accuracy of several nanometers.

[Patent Literature 1] Japanese Patent Application Laid-open No. 2015-185594

SUMMARY OF THE INVENTION

In the etching of the absorbing and desorbing type, the etching is performed in a step-by-step manner by alternately performing the absorption process and the desorption process in a cyclic manner, and thus compared to a conventional etching method of proceeding etching through consecutive plasma irradiation, there arises a problem that it takes time for processing upon etching of films of the same thickness. Thus, shortening of respective time for the absorption and desorption processes has become an issue. Typically, for the shortening of the time of the absorption process, the radical required for the reaction needs to be efficiently supplied to the wafer. For efficient irradiation of short-life radical to the wafer in particular, one of effective measures is to shorten a distance between a radical generation region and the wafer. Moreover, for the purpose of shortening the time of the desorption process, one of effective measures is to use an IR lamp (infrared lamp) for the purpose of shortening heating time.

One of effective techniques for shortening the time of the absorption process is to shorten the distance between the radical generation region and the wafer as described above, but upon incidence of a given amount of ions on the wafer at this time results in removal of the reaction layer through ion bombardment, which therefore requires a reduction in the amount of ion incidence on the wafer. Effective as a method of reducing the amount of ion incidence on the wafer is a method of installing an ion-screening slit plat (punched plate) between the plasma generation region and the wafer.

In contrast, even upon adhesion of some amount of deposition radicals on a chamber wall surface on which a given amount of ion incidence is present, it is removed through ion bombardment, making it easy to suppress growth of the deposited film. However, installation of the ion-screening slit suppresses the amount of ion incidence on the wall surface downstream thereof, raising a problem that the deposition radicals adheres and is formed into a film and this is detached in particles of foreign matter, resulting in wafer contamination. This problem is significant for a slit plate serving as a radical flow path in particular.

It is an object of the present invention to provide a vacuum processing apparatus of an absorbing and desorbing type that is capable of reducing deposition radicals on a slit plate even in a case where the slit plate for ion screening has been disposed.

To address the object described above, a vacuum processing apparatus according to one aspect of the invention includes: a vacuum container including therein a processing chamber; a sample stage which is disposed in a lower part of the processing chamber and on which a wafer is located; a plasma generating chamber which is arranged above the processing chamber and in which plasma is generated by using processing gas supplied therein; a flow path between the processing chamber and the plasma generating chamber communicating the processing gas, and through which particles of the processing gas and the plasma in the plasma generating chamber flow into the processing chamber; dielectric plate members arranged above a top surface of the sample stage and inside the flow path having a plurality of introduction holes through which the particles in the plasma generating chamber are introduced; at least one lamp disposed in an outer circumferential region of the flow path above the processing chamber, and the at least one lamp further being disposed surrounding the flow path and being configured to emit electromagnetic waves; a ring-shaped window member arranged between the processing chamber and the at least one lamp, and the window member including a ring-shaped bottom plate portion facing the inside of the processing chamber and an inner side wall portion disposed on an inner side of the bottom plate portion facing the inside of the flow path; a reflector arranged above the at least one lamp which reflects the electromagnetic waves from the at least one lamp toward the processing chamber; and wherein the bottom plate portion and the inner side wall portion of the window member are constituted by a single member transmitting the electromagnetic waves therethrough.

The present invention can provide a vacuum processing apparatus of an absorbing and desorbing type that is capable of reducing deposition radicals on a slit plate even in a case where the slit plate for ion screening has been disposed.

DETAILED DESCRIPTION OF THE PREFERRED EMBODIMENTS

As a result of review on solution to the problem described above by the inventors, in a plasma processing apparatus composed of a plasma source and a heating lamp, disposed between a wafer and the plasma source is a wafer-heating lamp unit formed by use of IR lamps, and at a center of the lamp unit, a flow path serving as a radical passage is provided, on which slit plates provided with a plurality of holes for screening ions and electrons generated by the plasma are disposed. Further, the heating lamp is disposed in air atmosphere, an IR light-transmissive window which partitions reduced pressure atmosphere in the processing chamber and the air atmosphere is disposed below the IR lamps, and this window has a cylindrical structure disposed at a center thereof so that this window forms part of the flow path. Then the slit plates are disposed at a position lower than a top surface of the cylindrical structure. As a result, not only the wafer but also the slit plates can be heated by the IR lamps for wafer heating.

As a result, the slit plates for the ion screening are also heated by light for the wafer heating, thus reducing an amount of radical of a deposited film on the slit plates and suppressing formation of particles of foreign matter attributable to the formation of the deposited film.

Hereinafter, the embodiments of the present invention will be described in detail with reference to the drawings. Note that the same numerals denote the same components.

First Embodiment

First, schematic overall configuration of a plasma processing apparatus according to the embodiments of the invention will be described with reference to FIG. 1. Described in this embodiment is an etching apparatus as an example of a vacuum processing apparatus, although the invention is not limited thereto.

Figure 1:
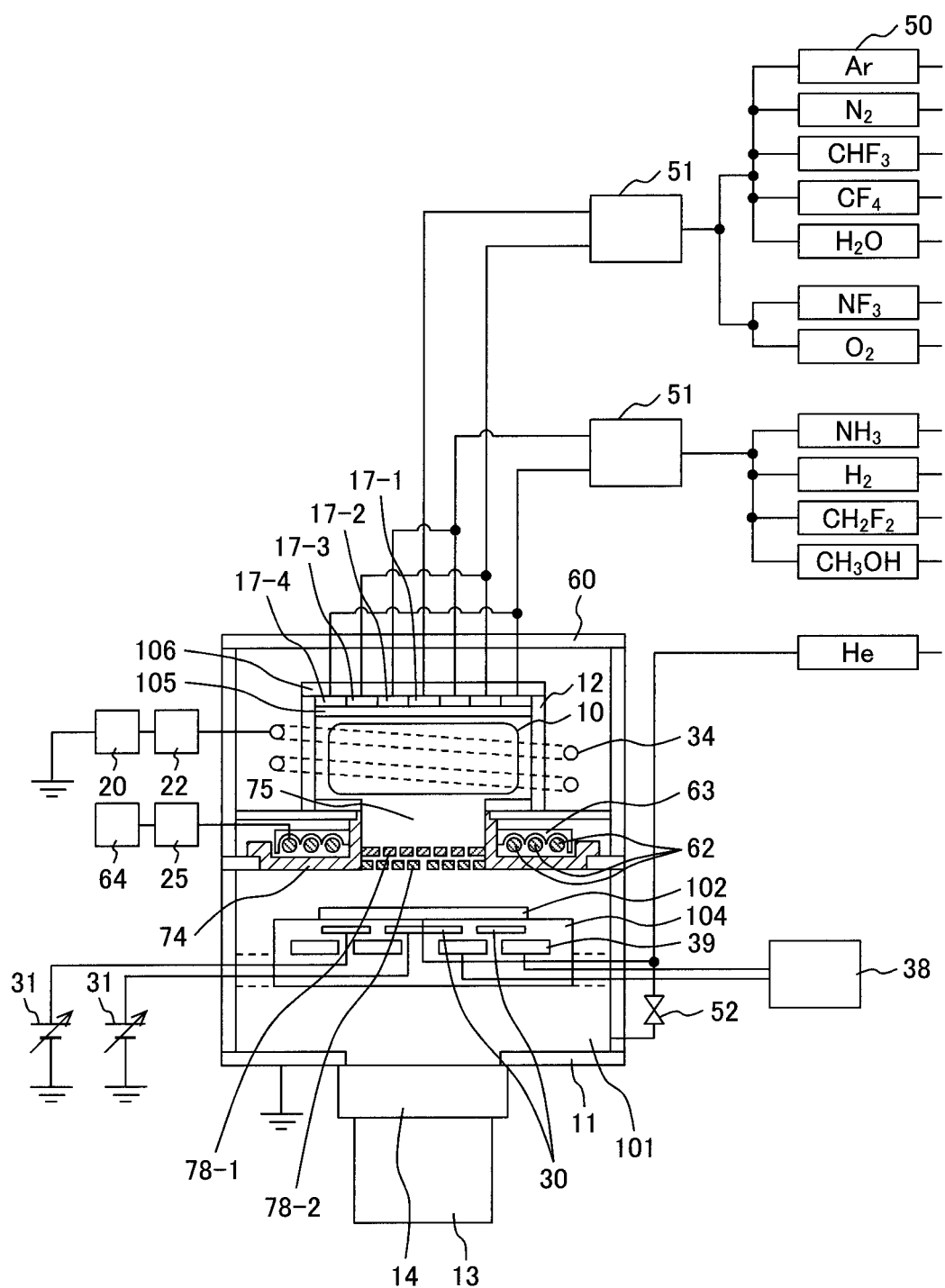
FIG. 1 is a schematic sectional view (partially a block diagram) of overall configuration of a plasma processing apparatus according to a first embodiment of the present invention.

This plasma etching apparatus has a base chamber 11 disposed blow a processing chamber 101 as shown in FIG. 1, and in the base chamber 11, a stage (sample stage) 104 for placing a wafer 102 thereon is disposed. Disposed above the processing chamber 101 is a plasma source, for which an inductively coupled plasma (ICP) discharge method is adopted. A quartz chamber 12 of a cylindrical shape forming the ICP plasma source is disposed above the processing chamber 101, and on an outer side of the quartz chamber 12, an ICP coil 34 is disposed. A high-frequency power supply 20 for plasma generation is connected to the ICP coil via a matching box 22. For frequency of the high-frequency power, several tens of megahertz, for example, 13.56 MHz is used.

Disposed at a top part of the quartz chamber 12 is a top panel 106. Disposed at a bottom part of the top panel 106 are: gas dispersing plates 17 (including 17-1, 17-2, 17-3, and 17-4 portions) and a shower plate 105, and processing gas is introduced into the processing chamber 101 via the gas dispersing plates 17 and the shower plate 105. Of the processing gas, flammable gas is supplied to the dispersing plate 17-2 and 17-4, combustion-supporting gas and gas, neither flammable nor combustion-supporting (here, simply called inactive gas), are supplied to the dispersing plates 17-1 and 17-3. A flow amount of the processing gas is adjusted by a mass flow controller 50 disposed for each gas kind, and a gas distributor 51 is disposed on a downstream side of the mass flow controllers. This makes it possible to perform independent control of amounts and composition of the flammable gas supplied to an area around a center and the flammable gas supplied to an area around outer circumference and mixed gas of the combustion-supporting gas and the inactive gas supplied to the area around the center and mixed gas of the combustion-supporting gas and the inactive gas supplied to the area around the outer circumference to thereby achieve detailed control of the spatial distribution. In FIG. 1, $NH_3$, $H_2$, $CH_2F_2$, and $CH_3OH$ are described as the flammable gas and $O_2$ and $NF_3$ are described as the combustion-supporting gas, but different gas may be used. Moreover, Ar, $N_2$, $CHF_3$, $CF_4$, and $H_2O$ are described as the inactive gas in FIG. 1, but different gas may be used. Moreover, the inactive gas is supplied to the dispersing plates together with the combustion-supporting gas in FIG. 1, but it may be mixed with the flammable gas to be supplied.

At a bottom part of the processing chamber 101, an exhaust unit 13 including a turbo-molecular pump, a dry pump, etc. for reducing pressure in the processing chamber is connected with a pressure-adjusting valve 14 in between. Numeral 10 denotes plasma, numeral 52 denotes a valve, and numeral 60 denotes an outside cover.

Disposed at the height position between the stage 104 and the ICP plasma source is an IR lamp unit as the lamp unit for heating the wafer (sample) 102. The IR lamp unit is mainly composed of: IR lamps 62, a reflective plate 63 for reflecting IR light, and an IR light-transmissive window 74. As the IR lamp 62, a circle-type (circle-shaped) lamp is used. Light radiated from the IR lamp is mainly composed of light (electromagnetic waves) in a region ranging from visible light to infrared light. In this embodiment, the lamps (62-1, 62-2, and 62-3) for three loops are disposed, but those for two or four loops may be disposed. Moreover, one loop of the lamp may be formed of one lamp of an annular shape, or for example, four lamps each shaped into an arc of 90 degrees annularly may be aligned to form one annular lamp for use. Disposed above the IR lamps is the reflective plate 63 for reflecting the IR light.

Connected to the IR lamps 62 is an IR lamp power supply 64 in between which a high-frequency cut filter 25 for avoiding flow of noise of high-frequency power for plasma generation into the IR lamp power supply is disposed. Moreover, the IR lamp power supply 64 has such a function that permits mutually independent control of power supplied to the IR lamps 62-1, 62-2, and 62-3, so that radial distribution of amounts of wafer heating can be adjusted (wires are partially omitted from the illustration).

Disposed at a center of the IR lamp unit is a flow path 75. Then disposed in this flow path 75 are slit plates 78 (including portions 78-1 and 78-2) having a plurality of holes open for screening the ions and electrons generated in the plasma and transmitting only neutral gas and neutral radical therethrough to irradiate them to the wafer. Disposed from an area below the IR lamps towards a side of an inner side of the lamps (a gas flow path 75 side) is the IR light-transmissive window 74 formed of quartz for passage of IR light. The IR light-transmissive window 74 is formed of an integral member including the area below the IR lamp to the side of the inner side of the lamp.

Formed inside of the stage 104 are flow paths 39 of a stage-cooling refrigerant, which is circularly supplied by a chiller 38. Moreover, to fix the wafer 102 through electrostatic absorption, embedded in the stage are electrode plates (electrodes for the electrostatic absorption) 30 of a plate-like shape, to each of which a DC power supply (power supply for the electrostatic absorption) 31 is connected. Moreover, to efficiently cool the wafer 102, He gas can be supplied between a rear surface of the wafer 102 and the stage 104.

Next, details of configuration of the IR light-transmissive window and the slit plates disposed in the lamp unit and their positional relationship will be described with reference to FIG. 2. The IR light-transmissive window 74 has a cylindrical structure disposed at a center thereof in a manner such as to permit not only downward transmission of the IR light (towards the wafer) but also transmission of this light towards a radial center thereof, and this cylindrical structure portion forms part of the flow path 75 at the center of the lamp unit. Provided above the cylindrical structure portion is an O-ring sealing surface 79-1 for vacuum sealing. A height of this O-ring sealing surface 79-1 (position a of FIG. 2) is disposed at a position higher than a height of a lower end 81-1 inside of the reflective plate (position b of FIG. 2). Numeral 143 denotes a spacer.

The slit plates 78 disposed on the flow path 75 are formed in two steps (78-1 and 78-2) in a vertical direction. FIGS. 3A to 3C schematically show the slit plates. FIG. 3A shows the upper slit plate 78-1, and FIG. 3B shows the lower slit plate 78-2. The slit plate has several hundreds of circular holes (gas holes) 142 (including portions 142-1 and 142-2) of several millimeters in diameter provided on a quartz (dielectric body) plate. The neutral gas and the neutral radical are transferred from a plasma side to a wafer side via these holes. A thickness of the slit plate is set at several millimeters to several centimeters. FIG. 3C shows positional relationship between the gas holes the two slit plates are viewed from above the processing chamber. The holes provided on the two slit plates 78-1 and 78-2 are shifted in phase from each other, and the plasma side cannot be directly viewed from the wafer side, thereby improving effect of screening the ions and the electrons. A gap between the two slit plates 78-1 and 78-2 is determined by the spacer 143 disposed between the slit plates (FIG. 2). The gap between the slit plates 78-1 and 78-2 determined by the spacer 143 is set at several millimeters to several centimeters. A diameter and a number of the plurality of slit plates and the gap therebetween are determined by conductance of a gas flow. The slit plates have roles of screening the ions and the electrons generated in the plasma and permitting passage of the neutral gas and radical therethrough, and thus a too small diameter of the holes, a too small number of holes, a too close distance between the two slit plates, and a too large thickness of the slit plates result in improved effect of screening the ions and the electrons but in smaller conductance, making the passage of the neutral gas and the radical difficult. Thus, it is desirable to adjust various dimensions so that a pressure value of a plasma-generating region in a space above the slit plates becomes as close as possible to a pressure value of a region below the slit plates where the radical is irradiated to the wafer (so that the conductance becomes larger). For example, like in a case where the pressure of the processed gas above the slit plate 78-1 is 50 Pa while the pressure of the processed gas in the wafer region below the slit plat 78-2 is 45 Pa, it is desirable that the both values do not differ from each other by, for example, twice or more.

Figure 4:
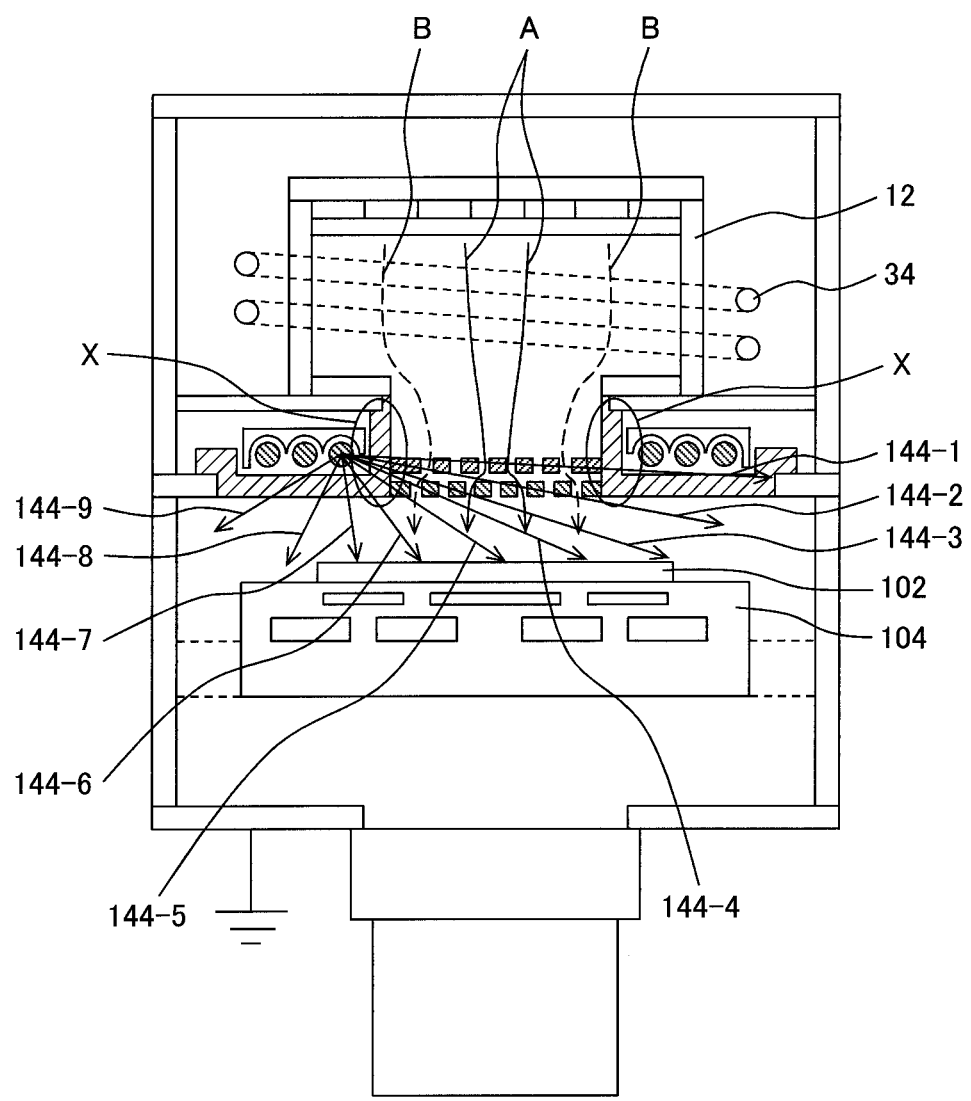
FIG. 4 is a sectional view illustrating irradiation directions of IR light and gas flows in the plasma processing apparatus shown in FIG. 1.

FIG. 4 shows an example of directions in which light of the IR lamp is irradiated (apparatus configuration is equal to that of FIG. 1). Arrows 144 (from 144-1 to 144-9) in FIG. 4 denote the irradiation directions of the light radiated from the lamp disposed on an innermost side from a left in the figure. A height of the slit plates 78 (the position c of FIG. 2) is disposed at a position lower than the lower end 81-1 (the position b of FIG. 2) inside of the reflective plate 63. As a result, as shown by, for example, the arrows 144-1 through 144-4, part of the IR light radiated from the IR lamp can be irradiated to the slit plates 78 to heat the slit plates 78. This suppresses adhesion of the deposition radicals to the slit plates. Moreover, a surface of the slit plates may be formed to be minutely bumpy to adjust a rate of light permeability. Moreover, it is desirable to use synthetic quartz with high transmittance of the IR light for the IR light transmissive window, but for the quarts of the slit plates, fused quartz with a relatively high amount of infrared ray absorption may be used. That is, for the IR light transmissive window and the slit plates, materials having mutually different transmittance of the IR light may be used.

A material of the spacer 143 is the same as that of the slit plates. Moreover, since the upper slit plates 78-1 are exposed to the plasma, they are expected to be heated by the plasma to some extent, but the lower slit plates 78-2 are greatly screened by the ions, and thus cannot be expected to be heated. Thus, there are high demands for heating the lower slit plates in particular by the IR light. Thus, the installation position may be adjusted so that at least the lower slit plates can efficiently be heated by the IR light.

As can be seen from FIG. 4, adopting configuration such that the IR light-transmissive window 74 is also disposed on the inner side and the side (X in FIG. 4) of the IR lamp has an advantage that a wafer surface opposite to an IR light radiation position on the IR lamp and surroundings of the wafer center when viewed from the wafer center can be heated, as shown by the arrows 144-3 to 144-5. In a case where the X portion of FIG. 4 is formed of a material not transmitting the IR light therethrough, the wafer center cannot be heated and the wafer surface opposite to the IR light radiation position cannot also be heated, thus deteriorating wafer heating power and heating uniformity.

Moreover, layout of the O-ring sealing surface 79-1 (position a of FIG. 2) at a position higher than the lower end 81-1 (the position b of FIG. 2) inside of the reflective plate can avoid direct hitting of the O-ring (seal member) 80 by the IR light, which can suppress deterioration of the O-ring 80. Further, outer circumference of the IR light-transmissive window 74 is stepped, and an O-ring sealing surface 79-2 at an outer circumferential part is disposed at a position higher than a lower end 81-2 at outer circumference of the reflective plate 63, thereby preventing the IR light from directly hitting the O-ring 80. That is, the reflective plate 63 is also used as a cover screening electromagnetic waves directed towards the O ring (seal member) 80.

Figure 5:
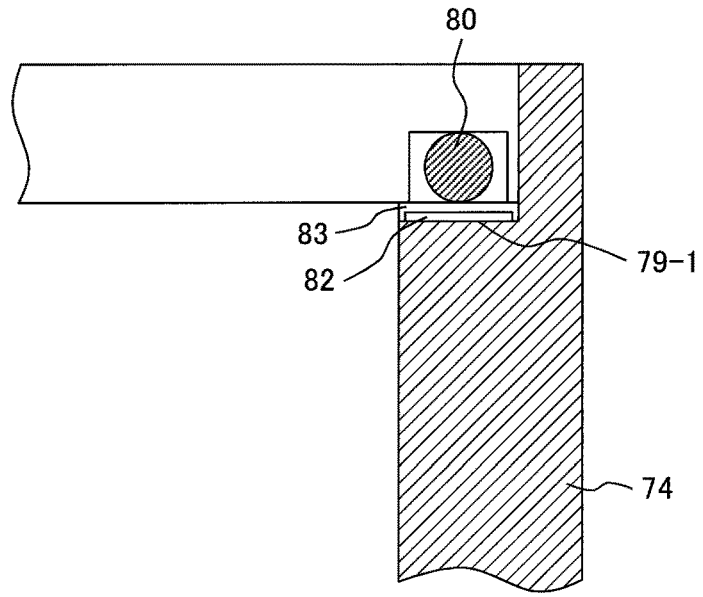
FIG. 5 is a sectional view illustrating details of an O-ring sealing surface of the IR light-transmissive window shown in FIG. 2.

The direct irradiation of the IR light from the IR lamp onto the O-ring 80 is avoided in this manner, but part of the light is reflected in the IR light-transmissive window 74, reaching the O-ring. Thus, to avoid direct hitting of the O-ring 80 by the IR light to possible extent, as shown in FIG. 5, a reflective layer (electromagnetic wave transmission suppressing member) 82 of, for example, aluminum is deposited at the O-ring sealing surface 79-1 of the IR light-transmissive window 74, and to avoid a deterioration of the reflective layer 82 caused by the radical entering into a gap between joining surfaces, surroundings of the reflective layer 82 may be coated with an anti-plasma protection layer 83 of yttria ($Y_2O_3$). In this case, the O-ring 80 hits the plasma-resisting protection layer to seal a vacuum. It is needless to say that the O-ring sealing surface 79-2 may also be similarly coated with a reflective layer and a plasma-resisting layer.

The various dimensions of the apparatus are as follows. In order that the inner processed gas supplied from dispersing plates 17-1 and 17-2 is substantially dissociated and ionized in the plasma 10 and the neutral radical and gas pass through a substantially central area of the slit plates to be irradiated to the surroundings of the wafer center (arrows A of FIG. 4), and in order that the outer processed gas supplied from the dispersing plates 17-3 and 17-4 is dissociated and ionized in the plasma 10 and the neutral radical and gas pass through a substantially outer side of the slit plate to be irradiated to the surroundings of the wafer outer circumference (arrow B of FIG. 4), it is desirable that a diameter of the flow path 75 and a diameter of the slit plates 78 are at least half a diameter of the wafer to reduce mutual dispersion and mixture of the inner gas and the outer gas. In contrast, a too large diameter of the flow path 75 results in a too long distance between the IR lamp and the wafer, which leads to a decrease in the wafer heating power, and thus the diameter of the flow path 75 or the inner lamp 62-1 is set equivalently to that of the wafer. Therefore, in a case where the diameter of the wafer is 300 mm (30 cm), the diameters of the flow path 75 and the slit plate (a diameter of a punched region) at set at, for example, 20 cm through 30 cm. Moreover, a diameter of the quartz chamber 12 is 20 to 30 cm, which is equivalent to the diameter of the wafer.

A distance between the IR light-transmissive window 74 and the wafer 102 is several centimeters (for example, 5 cm) or more, so that exhaust of the processed gas and the radical can smoothly be performed. A difference between a height position of the IR lamp and a height position of the wafer is approximately 10 cm to 20 cm to thereby avoid a too long distance between the IR lamp and the wafer. Moreover, to efficiently irradiate short-life radical to the wafer, a distance between the plasma or the ICP coil and the wafer is within several tens of centimeters (for example, 30 cm).

An example of processing procedures of this apparatus configured as described above will be described with reference to FIGS. 6 and 7. After the wafer is loaded into the processing chamber 101 through a wafer transport port (not shown) provided in the processing chamber 101 (loading process, (1) of FIG. 7, wafer loading of FIG. 6), the wafer is fixed by the DC power supply 31 for electrostatic absorption and He gas for wafer cooling is supplied to the rear surface of the wafer. Then a flow rate of the processed gas supplied into the processing chamber 101 and gas composition distribution in the processing chamber 101 are adjusted by the plurality of mass flow controllers 50 and the gas distributor 51, and plasma discharge is started by the discharge power supply 20. Then the processed gas is ionized and dissociated in the plasma 10, and the neutral gas and radical pass through the slit plates 78 and are irradiated to the wafer 102 having a layer 95 to be etched. This absorbs the radical to the wafer surface to form a reaction layer 96 on a surface of the layer 95 to be etched (absorption process, (2) of FIG. 7, and a region where high-frequency power is ON in FIG. 6). Here, the layer 95 to be etched is a layer of, for example, Si, $SiO_2$, SiN, W, TiN, TiO, or $Al_2O_3$.

Upon completion of the formation of the reaction layer 96, the discharge power supply 20 is turned off to stop the plasma discharge. Then the supply of the He gas to the wafer rear surface is stopped, and a valve 52 is opened to make a pressure of the wafer rear surface equivalent to the pressure inside the processing chamber. Then the DC power supply 31 is turned off to release the wafer electrostatic absorption.

Next, output of the IR lamp power supply 64 is turned on to light up the IR lamp 62. The IR light radiated from the IR lamp 62 is transmitted through the IR light-transmissive window 74 to heat the wafer and the slit plates.

Figure 6:
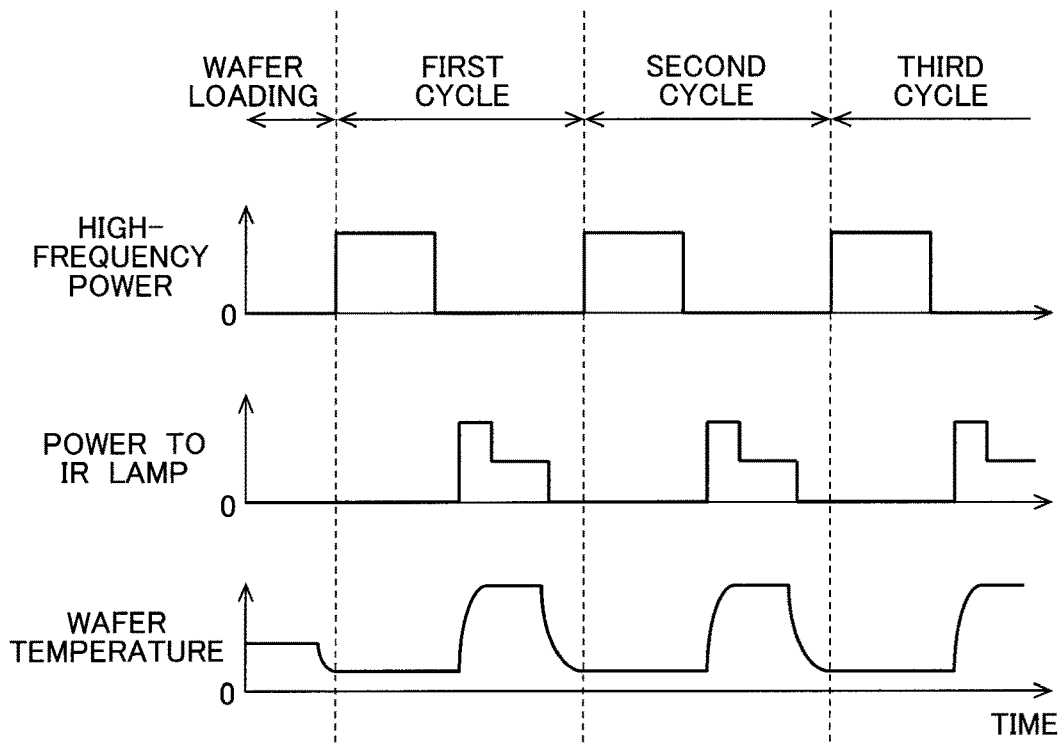
FIG. 6 is a diagram illustrating etching processing procedures in the plasma processing apparatus shown in FIG. 1, with a top level showing high-frequency power with respect to processing time, a middle level showing power supplied to the IR lamp with respect to the processing time, and a bottom level showing a wafer temperature with respect to the processing time.
Figure 7:
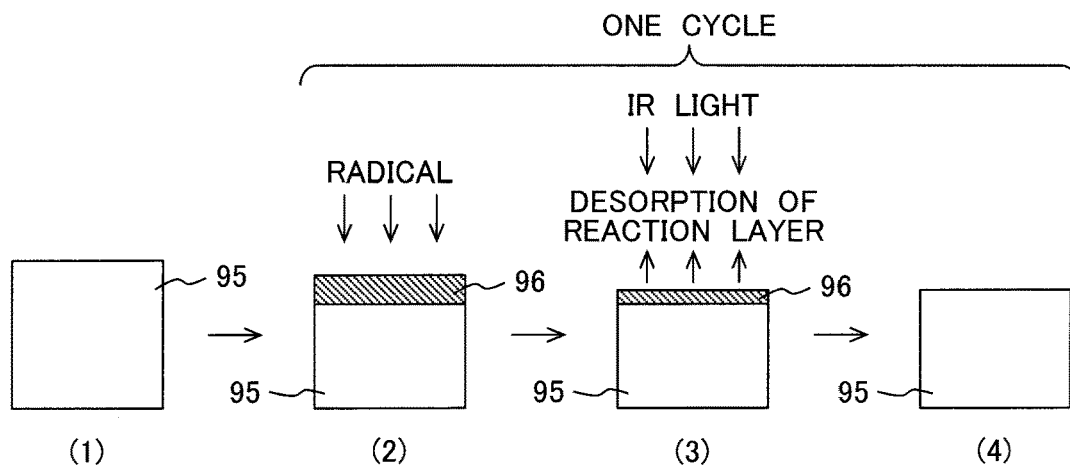
FIG. 7 is a partially sectional view illustrating progress of the etching processing performed on a processed subject in the plasma processing apparatus shown in FIG. 1.

Upon reach of a wafer temperature at a given value, the output of the IR lamp power supply 64 is reduced, and the reaction layer 96 is desorbed while keeping the wafer temperature constant (desorption process, (3) of FIG. 7, a region where the power of the IR lamp is ON in FIG. 6).

Subsequently, the output of the IR lamp power supply 64 is turned off to stop the heating of the wafer. Next, while Ar gas is supplied into the processing chamber, the He gas is supplied to the wafer rear surface to start cooling of the wafer (cooling process, (4) of FIG. 7, a region where the IR lamp is OFF in FIG. 6). At this point, a difference between a pressure of the Ar gas and a pressure of the He gas is set at approximately 0.5 kPa or below. For example, assumed is that the pressure of the Ar gas in the processing chamber 101 is 0.8 kPa and the pressure of the He gas on the wafer rear surface is 1 kPa (to avoid hopping of the wafer with the pressure of the He gas on the rear surface). Then upon reach of the wafer temperature at 50 to 100 degrees Celsius or below, the DC power supply 31 is turned on to fix the wafer through electrostatic absorption, and the Ar gas supply into the processing chamber is stopped or its flow rate is reduced. Then the wafer temperature is further reduced to approximately a temperature of the stage 104. The temperature of the stage is set at approximately minus 40 to 40 degrees Celsius. The wafer is not subjected to the electrostatic absorption from the beginning in the wafer cooling for the purpose of avoiding scratching of the wafer rear surface as a result of abrasion between the stage and the wafer following shrinkage of the wafer in the cooling process and breakage of the wafer by stress. Upon end of the cooling, the radical irradiation is started again. Then a cycle of the radical absorption and desorption ((2) to (4) of FIG. 7) is repeated to perform etching in a step-by-step manner, and upon end of the etching, the wafer is carried out of the processing chamber 101. An increase in the number of this cycle can increase an amount of etching. This processing is controlled by a control unit (not shown)

Figure 2:
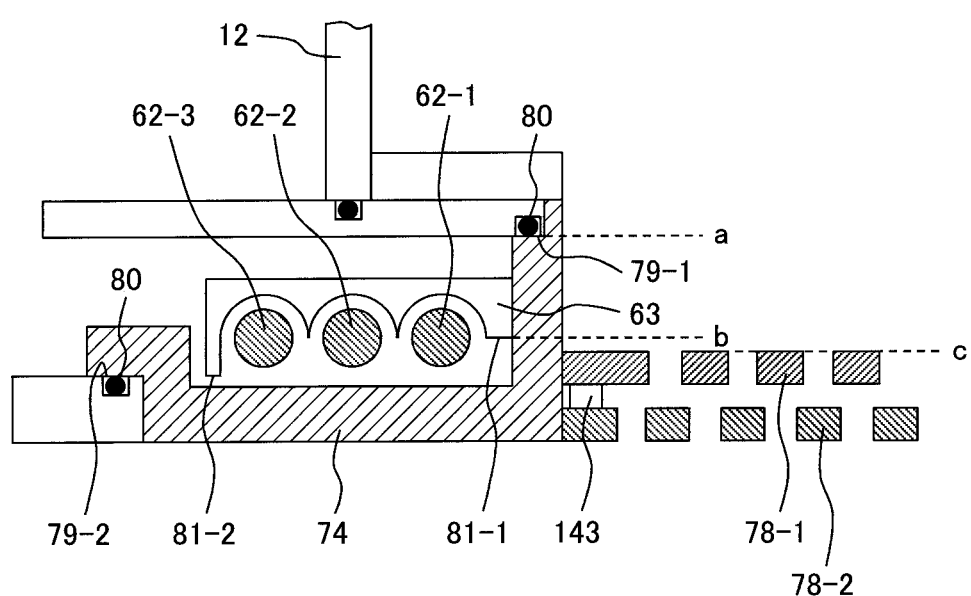
FIG. 2 is a sectional view of essential parts illustrating height positional relationship between IR lamps, an IR light-transmissive window, and their surroundings in the plasma processing apparatus shown in FIG. 1.
Figure 3A:
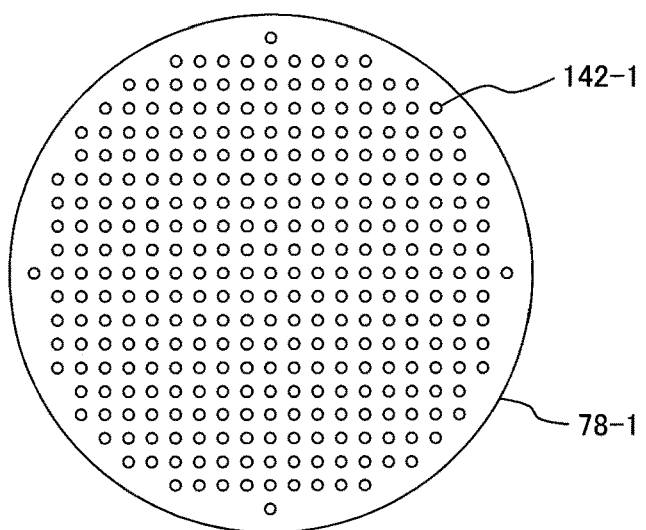
FIG. 3A is a plan view of an upper slit plate in the plasma processing apparatus shown in FIG. 1.
Figure 3B:
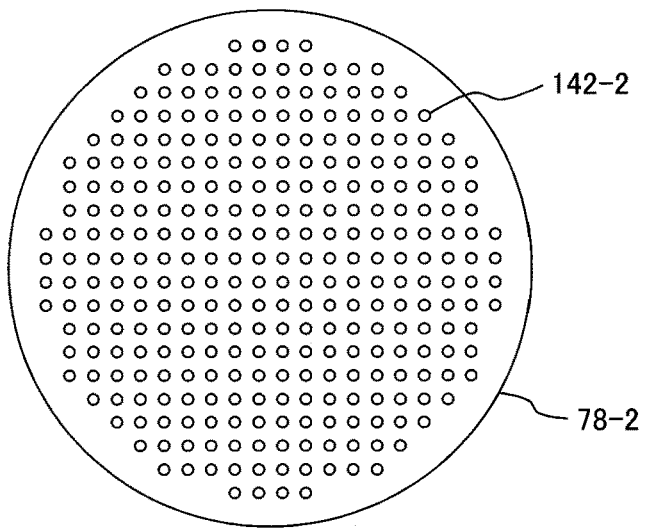
FIG. 3B is a plan view of a lower slit plate in the plasma processing apparatus shown in FIG. 1.
Figure 3C:
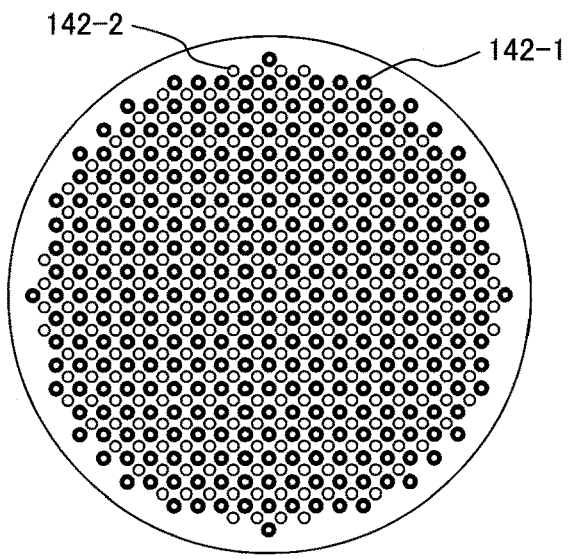
FIG. 3C shows positional relationship between gas holes of the upper and lower slit plates when the slit plates are viewed from above a processing chamber in the plasma processing apparatus shown in FIG. 1.

Using the plasma processing apparatus shown in FIG. 1 provided with the IR lamp unit shown in FIG. 2, isotropic etching processing is performed in accordance with procedures shown in FIGS. 6 and 7, as a result of which adhesion of a foreign matter due to the deposition radicals can be reduced to perform the etching with high accuracy.

As described above, this embodiment can provide a vacuum processing apparatus of an absorbing and desorbing type that is capable of reducing deposition radicals on a slit even in a case where the slit for ion screening has been disposed.

Second Embodiment

Next, another embodiment of the invention will be described with reference to FIGS. 8 and 9. Those described in the first embodiment but not in this embodiment can also be applied to this embodiment unless otherwise specified.

Figure 8:
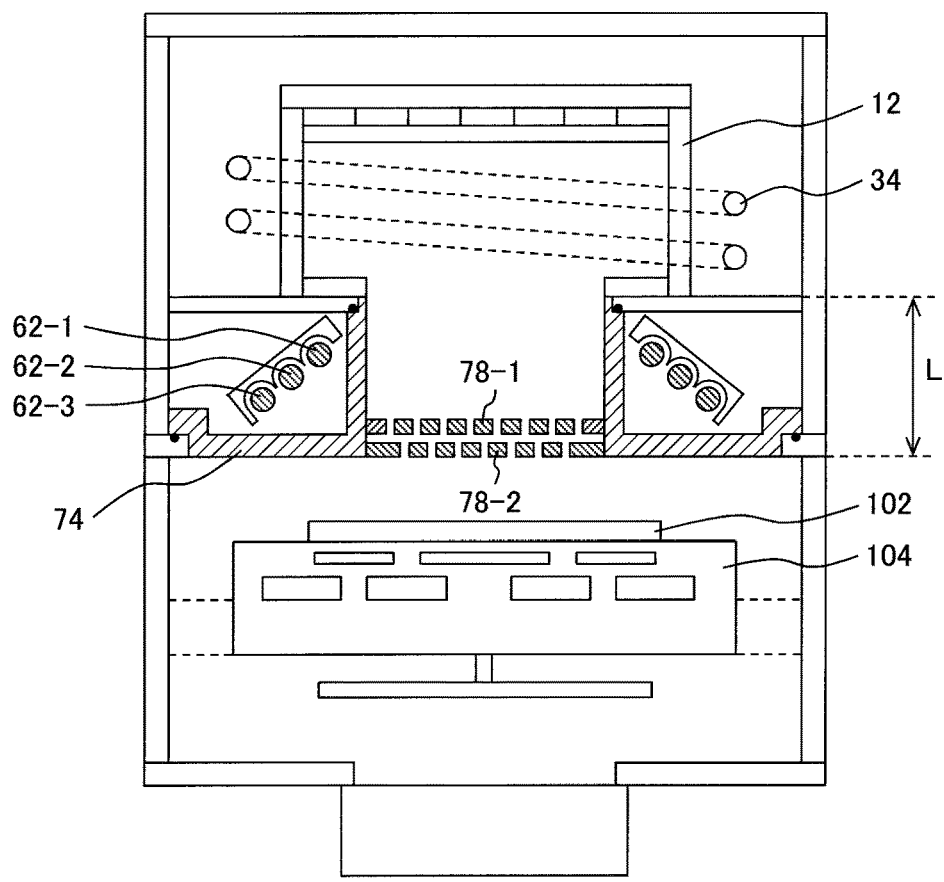
FIG. 8 is a sectional view of a plasma processing apparatus (main body) according to a second embodiment of the invention.

FIG. 8 is a sectional view of a plasma processing apparatus (main body part) according to the second embodiment of the invention. As shown in FIG. 8, instead of arranging the IR lamps 62 (here, 62-1, 62-2, and 62-3) on the same plane in a direction parallel to the wafer, a method of arranging them along a surface inclined with respect to the wafer is also assumed to be advantageous in terms of heating uniformity. However, in this case, a height L of the lamp unit is longer than that with the configuration of FIG. 1, and a distance between a radical-generating region and the wafer becomes longer accordingly. In terms of efficient irradiation of the short-life radical to the wafer, as shown in FIG. 1, it is better to array the IR lamps 62 in the direction parallel to the wafer to reduce the height of the lamp unit. Depending on use purpose, it can be switched between arranging the IR lamps 62 on the same plane in the direction parallel to the wafer and arranging them along the surface inclined with respect to the wafer.

Figure 9:
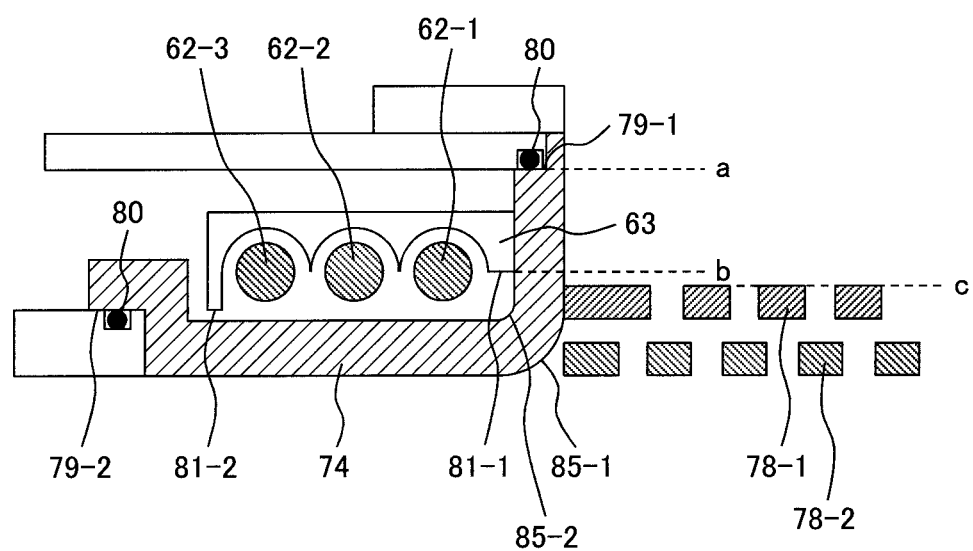
FIG. 9 is a sectional view showing another example of the light-transmissive window shown in FIG. 2.

In the plasma processing apparatus described in the first embodiment and the plasma processing apparatus of this embodiment shown in FIG. 8, a corner part at an inner bottom of the IR light-transmissive window 74 is formed at a right angle, but to adjust the uniformity in the wafer heating by the IR lamp, as shown in FIG. 9, it is desirable to provide mutually different curvatures for an outer curved part 85-1 of the IR light-transmissive window 74 and for an inner curved part 85-2 of the IR light-transmissive window 74 on a portion where a surface portion of the IR light-transmissive window 74 below the IR lamps and a side surface portion on an inner side of the IR lamps intersect with each other, thereby adjusting heating distribution to the wafer through lens effect.

As a result of performing the isotropic etching processing in accordance with the procedures shown in FIGS. 6 and 7 by using the plasma processing apparatus shown in FIG. 8, the etching can be performed with excellent uniformity, reduced adhesion of any foreign matter due to the deposition radicals, and high accuracy.

As described above, with this embodiment, even in a case where ion-screening slits are disposed, a vacuum processing apparatus of an absorbing and desorbing type that is capable of reducing deposition radicals on the slits can be provided. Moreover, arranging the IR lamps 62 along the surface inclined with respect to the wafer permits the etching to be performed with excellent uniformity. Moreover, providing the mutually different curvatures of the outer curved part 85-1 and the inner curved part 85-2 at the side and bottom corner part of the gas flow path of the IR light-transmissive window 74 makes it possible to adjust the heating distribution on the wafer.

The invention is not limited to the embodiments described above, and various modified embodiments can be included therein. For example, the embodiments above have been described in detail for easier understanding of the invention, and the invention is not necessarily limited to the one including all the configuration described. Moreover, part of the configuration of one embodiment can be replaced with that of another embodiment, and also the configuration of another embodiment can be added to the configuration of one embodiment. Moreover, for part of the configuration of each embodiment, addition, deletion, and replacement of another configuration can be done.

REFERENCE NUMERALS LIST

10: Plasma, 11: Base chamber, 12: Quartz chamber, 13: Exhaust unit, 14: Pressure-adjusting valve, 17, 17-1, 17-2, 17-3, 17-4: Gas dispersing plates, 20: High-frequency power source, 22: Matching box, 24: DC power supply, 25: Filter, 30: Electrode for electrostatic absorption, 31: Power supply for electrostatic absorption, 33: Quartz chamber, 34: ICP coil, 38: Chiller, 39: Refrigerant flow path, 50: Mass flow controller (MFC), 51: Gas distributor, 52: Valve, 60: Outside cover, 62, 62-1, 62-2, 62-3: IR lamps, 63: Reflective plate, 64: IR lamp power supply, 74: IR light-transmissive window, 75: Flow path, 78, 78-1, 78-2: Slit plates, 79-1, 79-2: O-ring sealing surfaces, 80: O-ring, 81-1, 81-2: Bottom surfaces of the reflective plate, 82: Aluminum film (reflective layer), 83: $Y_2O_3$ (plasma protection layer), 85-1, 85-2: Curved parts of the window, 95: Layer to be etched, 96: Reaction layer, 101: Processing chamber, 102: Wafer (sample), 104: Stage (sample stage), 105: Shower plate, 106: Top panel, 142, 142-1, 142-2: Gas holes, 143: Spacer.

What is claimed is:
1. A vacuum processing apparatus comprising;
a vacuum container including therein a processing chamber;
a sample stage which is disposed in a lower part of the processing chamber and on which a wafer is located;
a plasma generating chamber which is arranged above the processing chamber and in which plasma is generated by using processing gas supplied therein;
a flow path between the processing chamber and the plasma generating chamber communicating the processing gas, and through which particles of the pro- cessing gas and the plasma in the plasma generating chamber flow into the processing chamber;

dielectric plate members arranged above a top surface of the sample stage and inside the flow path having a plurality of introduction holes through which the particles in the plasma generating chamber are introduced;

at least one lamp disposed in an outer circumferential region of the flow path above the processing chamber, and the at least one lamp further being disposed surrounding the flow path and being configured to emit electromagnetic waves;

a ring-shaped window member arranged between the processing chamber and the at least one lamp, and the window member including a ring-shaped bottom plate portion facing the inside of the processing chamber and an inner side wall portion disposed on an inner side of the bottom plate portion facing the inside of the flow path;

a reflector arranged above the at least one lamp which reflects the electromagnetic waves from the at least one lamp toward the processing chamber; and wherein the bottom plate portion and the inner side wall portion of the window member are constituted by a single member transmitting the electromagnetic waves therethrough.

2. The vacuum processing apparatus according to claim 1, wherein the inner side wall portion of the ring-shaped window member has a cylindrical shape and an inner side wall of which constitutes the flow path, and wherein the electromagnetic waves from the at least one lamp transmit through into the processing chamber.

3. The vacuum processing apparatus according to claim 1, wherein the at least one lamp includes a circle shaped lamp disposed surrounding the flow path.

4. The vacuum processing apparatus according to claim 1, further comprising:

a seal member which provides an air-tight seal between an inside and outside of the processing chamber, the seal member being arranged at an upper end of the inner side wall portion of the window member; and a cover being arranged between the at least one lamp and the seal member and screening the seal member from the electromagnetic waves.

5. The vacuum processing apparatus according to claim 1, the window member further comprising an outer curved portion disposed at a corner between the bottom plate portion and the inner side wall portion of the window member.

6. The vacuum processing apparatus according to claim 5, wherein the outer curved portion faces the processing chamber and has a curvature that is different from an inner curved portion facing the at least one lamp.

7. The vacuum processing apparatus according to claim 2, wherein the at least one lamp includes a circle shaped lamp disposed surrounding the flow path.

8. The vacuum processing apparatus according to claim 2, further comprising:

a seal member which provides an air-tight seal between an inside and outside of the processing chamber, the seal member being arranged at an upper end of the inner side wall portion of the window member; and a cover being arranged between the at least one lamp and the seal member and screening the seal member from the electromagnetic waves.

9. The vacuum processing apparatus according to claim 2, the window member further comprising an outer curved portion disposed at a corner between the bottom plate portion and the inner side wall portion of the window member.

10. The vacuum processing apparatus according to claim 9, wherein the outer curved portion faces the processing chamber and has a curvature that is different from an inner curved portion facing the at least one lamp.

* * * * *